(12) United States Patent
Iida et al.

(10) Patent No.: US 8,186,052 B2
(45) Date of Patent: May 29, 2012

(54) METHOD OF PRODUCING SUBSTRATE

(75) Inventors: Kenji Iida, Kawasaki (JP); Tomoyuki Abe, Kawasaki (JP); Yasutomo Maehara, Kawasaki (JP); Shin Hirano, Kawasaki (JP); Takashi Nakagawa, Kawasaki (JP); Hideaki Yoshimura, Kawasaki (JP); Seigo Yamawaki, Kawasaki (JP); Norikazu Ozaki, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 816 days.

(21) Appl. No.: 12/173,562

(22) Filed: Jul. 15, 2008

(65) Prior Publication Data
US 2009/0094824 A1 Apr. 16, 2009

(30) Foreign Application Priority Data
Oct. 12, 2007 (JP) ................................ 2007-267171

(51) Int. Cl.
*H05K 3/02* (2006.01)
*H05K 3/42* (2006.01)
*H05K 3/46* (2006.01)

(52) U.S. Cl. ............ 29/852; 29/830; 174/255; 205/125; 427/97.7

(58) Field of Classification Search ................ 29/852, 29/830–831, 846–847; 174/255–262, 264; 205/125, 126
See application file for complete search history.

(56) References Cited

U.S. PATENT DOCUMENTS

| 4,705,592 | A | * | 11/1987 | Bahrle et al. ................. 216/18 |
| 5,129,142 | A | * | 7/1992 | Bindra et al. ................. 29/852 |
| 5,153,987 | A | * | 10/1992 | Takahashi et al. ............ 29/852 |
| 5,949,030 | A | | 9/1999 | Fasano et al. |
| 6,459,046 | B1 | * | 10/2002 | Ochi et al. .................. 174/256 |
| 6,722,031 | B2 | * | 4/2004 | Japp et al. ................... 29/852 |

(Continued)

FOREIGN PATENT DOCUMENTS
JP 2001-203458 7/2001
(Continued)

OTHER PUBLICATIONS

Japanese Office Action dated Jan. 10, 2012 issued in corresponding Japanese Patent Application No. 2007-267171.

*Primary Examiner* — Derris Banks
*Assistant Examiner* — Kaying Kue
(74) *Attorney, Agent, or Firm* — Staas & Halsey LLP

(57) ABSTRACT

The method of producing a substrate comprises the steps of: forming a through-hole in a base member; filling the through-hole with an insulating material; performing electroless plating to coat the surface of the base member, in which the through-hole has been filled with the insulating material, with an electroless-plated layer; applying photo resist on the electroless-plated layer formed on the surface of the base member; optically exposing and developing the photo resist so as to form a resist pattern coating an end face of the through-hole filled with the insulating material; etching an electrically conductive layer formed on the surface of the base member with using the resist pattern as a mask; and removing the resist pattern coating the end face of the through-hole from the base member with using the electroless-plated layer as a release layer.

11 Claims, 7 Drawing Sheets

U.S. PATENT DOCUMENTS

| | | | |
|---|---|---|---|
| 7,002,080 B2 * | 2/2006 | Tani et al. | 174/258 |
| 7,224,046 B2 * | 5/2007 | Abe et al. | 257/668 |
| 7,415,761 B2 * | 8/2008 | Hirose et al. | 29/852 |
| 7,435,352 B2 * | 10/2008 | Mok et al. | 216/13 |
| 7,603,772 B2 * | 10/2009 | Farnworth et al. | 29/852 |
| 7,832,098 B2 * | 11/2010 | Hirose et al. | 29/852 |
| 8,035,037 B2 * | 10/2011 | Iida et al. | 174/261 |
| 2004/0194303 A1 * | 10/2004 | Kim et al. | 29/852 |
| 2006/0029726 A1 * | 2/2006 | Mok et al. | 427/96.1 |
| 2007/0169343 A1 * | 7/2007 | Farnworth et al. | 29/847 |
| 2009/0095524 A1 * | 4/2009 | Iida et al. | 174/667 |

FOREIGN PATENT DOCUMENTS

| | | |
|---|---|---|
| JP | 2001-237510 | 8/2001 |
| JP | 2003-332739 | 11/2003 |
| JP | 2004-119691 | 4/2004 |
| JP | 2006-222216 | 8/2006 |
| JP | 2007-88202 | 4/2007 |
| JP | 2007-142348 | 6/2007 |
| KR | 1999-004487 | 6/1999 |
| KR | 10-2004-0027326 | 4/2004 |
| KR | 10-0722615 | 5/2007 |
| WO | 2004/064467 A1 | 7/2004 |

* cited by examiner

METHOD OF PRODUCING SUBSTRATE

BACKGROUND OF THE INVENTION

The present invention relates to a method of producing a substrate having a base member for forming a circuit board, etc., especially relates to a method including a step of filling a through-hole formed in the base member with resin.

Some test substrates, which are used for testing circuit boards, on which semiconductor elements will be mounted, and semiconductor wafers, include core substrates composed of carbon fiber-reinforced plastic (CFRP). In comparison with conventional glass-epoxy core substrates, thermal expansion coefficients of the core substrates composed of carbon fiber-reinforced plastic are small, and thermal expansion coefficients of the circuit boards having such core substrates can be corresponded to those of semiconductor elements to be mounted on the circuit boards. Therefore, thermal stress generated between a semiconductor element and a circuit board can be effectively avoided.

The circuit board is formed by laminating cable layers on the both side faces of the core substrate, and plated through-hole (PTH) sections are formed in the core substrate so as to mutually electrically connect the cable layers on the both side faces thereof. The plated through-hole sections are formed by boring through-holes in a substrate and forming plated layers (electrically conductive parts) on inner faces of the through-holes.

In case of the base member having the electrically conductive core section composed of, for example, carbon fiber-reinforced plastic, if the plated through-hole sections are formed by merely boring the through-holes and plating the inner faces thereof, the plated through-hole sections and the core section are electrically shorted. Thus, the plated through-hole sections are formed in the core substrate having the electrically conductive core section by the steps of: forming pilot holes, whose diameters are greater than those of the plated through-hole sections to be formed, in the base member; filling the pilot holes with insulating resin; and forming the plated through-hole sections in the filled through-holes. With this method, the plated through-hole sections and the core section are not electrically shorted (see JP Kohyo Gazette No. 2004/064467, JP Patent Gazette No. 2006-222216).

However, if the pilot holes are drilled, burrs are formed on inner faces of the pilot holes and the plated through-hole sections and the core section will be electrically shorted. To solve this problem, the inner faces of the pilot holes are coated with insulating layers so as not to electrically short the plated through-holes and the core section (see JP Patent Gazette No. 2006-222216). However, it is difficult to perfectly coat the rough inner faces of the pilot holes.

In case of forming the plated through-hole sections penetrating the pilot holes, the pilot holes are filled with resin. Thus, coating end faces of the cured resin filling the pilot holes with plated layers must be prevented so as not to electrically shorted with the plated through-hole sections.

The core substrate is formed by laminating cable layers on the both side faces of a core section. If the core section is composed of a material having a small thermal expansion coefficient, e.g., carbon fiber-reinforced plastic, great heat stresses work to boundary faces between the core section and the cable layers because the thermal expansion coefficients of the cable layers are much greater than that of the core section. By the great heat stresses, the cable layers will be separated from the core section or cracks will be formed therebetween.

SUMMARY OF THE INVENTION

The present invention was conceived to solve the above described problems.

An object of the present invention is to provide a method of producing a substrate, e.g., a substrate having an electrically conductive core section, the method can be suitably applied to a method comprising the steps of forming a pilot hole in a base member, filling the pilot hole with an insulating material and forming a plated through-hole section penetrating the filled pilot hole.

To achieve the object, the present invention has following constitutions.

Namely, the method of producing a substrate of the present invention comprises the steps of: forming a through-hole in a base member; filling the through-hole with an insulating material; performing electroless plating to coat the surface of the base member, in which the through-hole has been filled with the insulating material, with an electroless-plated layer; applying photo resist on the electroless-plated layer formed on the surface of the base member; optically exposing and developing the photo resist so as to form a resist pattern coating an end face of the through-hole filled with the insulating material; etching an electrically conductive layer formed on the surface of the base member with using the resist pattern as a mask; and removing the resist pattern coating the end face of the through-hole from the base member with using the electroless-plated layer as a release layer.

The present invention can be applied to not only the substrate having an electrically conductive core section but also a substrate having a plastic core, a circuit board, etc. The electroless-plated layer is formed on the surface of the base member so as to easily separate the resist pattern from the resin filling the through-hole after etching the conductive layer formed on the surface of the base member. The electroless plating forms, for example, a copper plated layer.

In the method, the through-hole may be a pilot hole for forming a plated through-hole section penetrating the through-hole; and the pilot hole may be filled with an insulating material, and then the electroless plating for coating the surface of the base member may be performed.

In the method, the electroless plating for coating the surface of the base member may be performed, an end face of the pilot hole filled with the resin is coated with the resist pattern, and the conductive layer on the surface of the base member may be etched to remove the resist pattern; and a through-hole penetrating the pilot hole may be formed, and an inner face of the through-hole may be coated by plating so as to form the plated through-hole section.

In the method, cable layers may be laminated on the both side faces of the base member after removing the resist pattern from the base member; and the through-hole penetrating the pilot hole may be formed in the base member, on which the cable layers have been integrally laminated, so as to form the plated through-hole section. With this method, the substrate, in which the cable layers are formed on the both side faces of the base member, can be produced.

In the method, the base member may have an electrically conductive core section; the inner face of the through-hole may be coated with a plated layer, which is formed by plating the base member, after forming the through-hole; and the surface of the base member may be coated by performing electroless plating after filling the through-hole with the resin.

In the method, the through-hole may be a pilot hole for forming a plated through-hole section penetrating the through-hole; the inner face of the pilot hole may be coated with a plated layer, which is formed by plating the base member; and the surface of the base member may be coated by performing the electroless plating after filling the pilot hole with the insulating material.

By coating the inner face of the pilot hole, which is formed in the conductive core section, with the plated layer, even if the pilot hole is drilled and the inner face of the pilot hole is roughened, the short circuit between the plated through-hole section and the core section can be prevented by the plated layer coating the inner face of the pilot hole.

Further, by coating the inner face of the pilot hole, the inner face can be made smooth so that no voids are formed in the insulating material, e.g., resin, while filling the pilot hole with the insulating material. Therefore, the short circuit between the plated through-hole section and the core section can be prevented.

In the method, the inner face of the pilot hole may be coated with an insulating film, which is formed by an electrodeposition method in which the plated layer is used as an electric power feeding layer, after coating the inner face of the pilot hole with the plated layer; and the pilot hole, whose inner face has been coated with the insulating film, may be filled with the insulating material. With this method, the inner face of the pilot hole is coated with not only the plated layer but also the insulating film, so that the short circuit between the plated through-hole section and the core section can be securely prevented.

In the method, a through-hole penetrating the pilot hole may be formed, and the inner face of the through-hole may be coated with a plated layer so as to form the plated through-hole section after performing the steps of performing the electroless plating to coat the surface of the base member, forming the resist pattern, etching the conductive layer formed on the surface of the base member and removing the resist pattern from the base member.

In the method, cable layers may be laminated on the both side faces of the base member after removing the resist pattern from the base member; and the through-hole penetrating the pilot hole may be formed in the base member, on which the cable layers have been integrally laminated, so as to form the plated through-hole section.

In the method, the through-hole may be filled with resin after forming the plated through-hole section is formed; and the conductive layer on the surface of the base member may be etched in a prescribed pattern so as to form a cable pattern, which is electrically connected to the plated through-hole section, on the surface of the base member. With this method, in case of forming the cable layers on the both side faces of the base member, the cable layers on the both side faces can be electrically connected.

In the method, cable layers may be laminated on the both side faces of the substrate so as to form a multi-layered substrate. With this method, the multi-layered substrate can be produced.

In the method, the cable layers may be laminated on the both side faces of the substrate by a build-up method.

In the method, the core section may be formed into a flat plate by heating and pressurizing a plurality of prepregs including carbon fibers. With this method, the substrate having a prescribed thermal expansion coefficient, which is smaller than that of a plastic substrate, can be produced.

The method of the present invention is characterized by the step of electroless-plating the surface of the base member, in which the through-hole is filled with the insulating material.

By forming the resist pattern coating the end face of the through-hole filled with the insulating material, the conductive layer formed on the surface of the base member can be removed by etching. Further, the resist pattern can be easily separated from the end face of the end face of the through-hole filled with the insulating material.

Therefore, the production method of the substrate can be simplified. In case of laminating the cable layers on the base member, the conductive layer formed on the surface of the base member can be suitably removed by etching, so that adhesiveness between the base member and the cable layers can be maintained. Further, separating the cable layers from the base member, which is caused by the difference of the thermal expansion coefficients of the both, can be prevented.

BRIEF DESCRIPTION OF THE DRAWINGS

Embodiments of the present invention will now be described by way of examples and with reference to the accompanying drawings, in which.

DETAILED DESCRIPTION OF THE EMBODIMENTS

Preferred embodiments of the present invention will now be described in detail with reference to the accompanying drawings.

(Steps of Forming Core Substrate)

In the following description, a method of producing a core substrate, which has a base member including an electrically conductive core section, will be explained as embodiments of the present invention.

FIGS. 1A-2B show the steps of: forming pilot holes, through which plated through-hole sections will be respectively pierced, in a base member; forming gas purging holes; and filling the pilot holes with insulating materials.

Figure 1A:
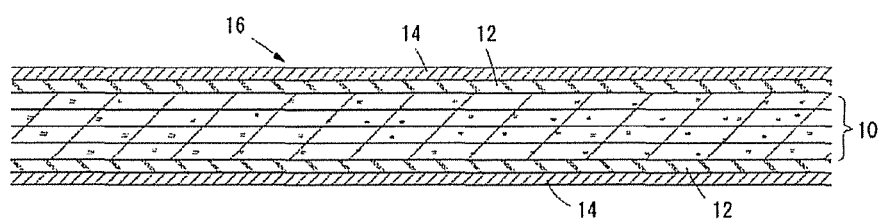
FIGS. 1A-1D are partial sectional views showing the steps of forming pilot holes and gas purging holes in a base member.

FIG. 1A shows a flat plate-shaped base member 16, which comprises a core section 10 composed of carbon fiber-reinforced plastic and copper foils 14 respectively bonded on the both side faces of the core section 10 with prepregs 12. The core section 10 is formed by the steps of: laminating four prepregs, each of which is formed by impregnating a carbon cloth with polymer, e.g., epoxy resin; and heating and pressurizing the laminated prepregs so as to integrate them. Note that, number of the laminated prepregs including carbon fibers, which constitute the core section 10, can be optionally selected.

In the present embodiment, the core section 10 is constituted by woven carbon fiber cloths, each of which is composed of carbon fiber filaments. Further, unwoven carbon fiber cloths, carbon fiber meshes, etc. may be used instead of the woven carbon fiber cloth. Thermal expansion coefficients of carbon fibers are about 0 ppm/° C., and a thermal expansion coefficient of the core section 10 can be adjusted by selecting: a rate of content of carbon fibers in the carbon fiber-reinforced plastic; resin materials included in the carbon fibers; fillers mixed with the resin, etc. In the present embodiment, the thermal expansion coefficients of the core section 10 is about 1 ppm/° C.

A thermal expansion coefficient of the entire base member having the core section 10 composed of the carbon fiber-reinforced plastic can be adjusted by selecting thermal expansion coefficients of cable layers, which constitute the base member, and insulating layers, which are provided between the cable layers. Further, a thermal expansion coefficient of a circuit board, which is formed by laminating build-up layers on the both side faces of the base member, can be properly adjusted by selecting thermal expansion coefficients of the base member and the build-up layers. Thermal expansion coefficients of semiconductor elements are about 3.5 ppm/° C. Thermal expansion coefficients of the circuit board can be easily corresponded to that of semiconductor elements to be mounted on the circuit board.

Figure 1B:
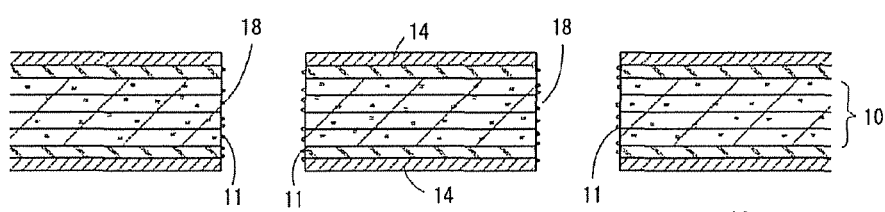
Figure 1C:
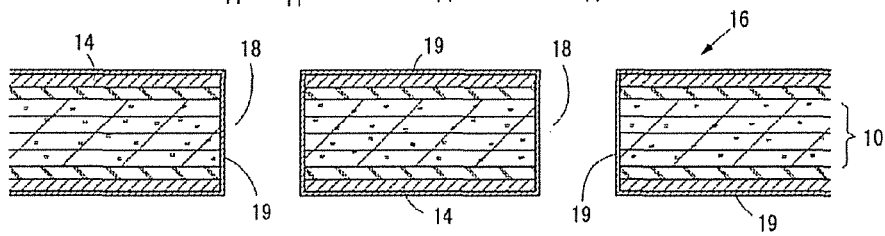

In FIG. 1B, pilot holes 18 are bored in the base member 16. The pilot holes 18 are through-holes, which are bored in the thickness direction of the base member 16 by a drill. Diameters of the pilot holes are greater than those of through-holes of plated through-hole sections, which will be formed in the following step. In the present embodiment, the diameters of the pilot holes 18 are 0.8 mm; the diameters of the through-holes of the plated through-hole sections are 0.35 mm. The pilot holes 18 are located at prescribed planar positions, which correspond to the plated through-hole sections to be formed in the base member.

When the pilot holes 18 are drilled, burrs are formed on inner faces of the pilot holes 18 due to, for example, abrasion of the drill, and the pilot holes 18 have rough or uneven inner faces. Further, drill dusts of the core section 10 will stick on the inner faces of the pilot holes 18.

In case of the core section 10 composed of carbon fiber-reinforced plastic, carbon dusts 11 stick on the inner faces of the pilot holes 18. The carbon dusts 11 have electric conductivity, so if the carbon dusts 11 invade into resin 20 filling the pilot holes 18, the insulation performance of the resin 20 is worsened. Further, the plated through-hole section and the core section 10 will be electrically shorted.

To prevent the short circuit between the plated through-hole sections and the core section 10, in the present embodiment, electroless copper plating and electrolytic copper plating are performed in this order after forming the pilot holes 18 in the base member 16 so as to coat the inner faces of the pilot holes 18 with copper plated layers 19. By electroless-plating the base member 16 with copper, the copper layer is formed on the entire inner faces of the pilot holes 18 and the entire side faces of the base member 16. Then, the electrolytic plating is performed with using the copper layer as an electric power feeding layer, so that the plated layers 19 can be formed on the inner faces of the pilot holes 18 and the both side faces of the base member 16 (see FIG. 1C). A thickness of the copper layer formed by the electroless plating is about 0.5 µm; thicknesses of the plated layers 19 formed by the electrolytic plating are about 10-20 µm.

By coating the inner faces of the pilot holes 18, the inner faces of the pilot holes 18 are made smooth, so that the pilot holes 18 can be easily filled with the resin 20 without forming voids. Therefore, the plated through-hole sections 20 and the core section 10 are not shorted at positions corresponding to voids. Further, the dusts 11 stuck on the inner faces of the pilot holes 18 are encompassed by or embedded in the plated layers 19, so that no dusts 11 are peeled from the inner faces thereof. With this structure, insulating performance of the resin 20 can be secured.

In the step of filling the pilot holes 18 with the resin 20, a heat treatment is performed so as to cure the resin 20, so a decomposition gas is generated from a plastic component of the core section 10 or moisture absorbed in the core section 10 is vaporized.

The decomposition gas and the water vapor, which are generated during the heat-curing step, move to exit from the core section 10, but the plated layers 19 coat the entire surfaces of the core section including the inner faces of the pilot holes 18. With this structure, the gas and the water vapor cannot exit therefrom, thus they expand the plated layers 19 coating the inner faces of the pilot holes and the copper foils 14 and the plated layers 19 coating the side faces of the base member 16. A purpose of forming the plated layer 19 is to coat the inner faces of the pilot holes 18 and make them smooth. If the plated layers 19 are expanded, the purpose cannot be achieved.

The structure of entirely coating the surfaces of the base member 16 including the inner faces of the pilot holes 18 with the plated layers 19 and the copper foils 14 causes the above described problem when the step of heat-curing the resin 20 in the pilot holes 18 is performed. Further, the structure causes the same problem when cable layers are formed on the both side faces of the base member 16 by heating and pressurizing cable sheets with prepregs.

In case of producing a circuit board by forming build-up layers on the both side faces of the base member 16, the process of forming the build-up layers includes heating steps, so the problem of expanding the copper foils 14 and the plated layers 19, which is caused by the gas generated from the core section 10 or the base member 16, will occur.

Thus, in the method of the present embodiment, gas purging holes 140 are formed in the surfaces of the base member 16 so as to securely form paths for discharging or purging the decomposition gas generated from the core section 10 and/or water vapor generated from the base member 16.

Figure 1D:
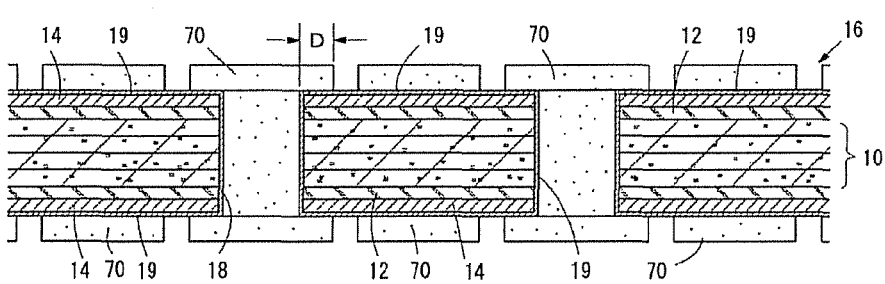

In FIG. 1D, dry film resist (photo resist) is applied on the both side faces of the base member 16, and then the photo resist is patterned to form resist patterns 70, in which parts corresponding to the gas purging holes 140 to be formed are exposed, by optically exposing and developing the photo resist, so as to form the gas purging holes 140 in the both side faces of the resist 16.

By forming the gas purging holes 140, the copper foils 14 coating the side faces of the base member 16 and the plated layers 19 laminating on the copper foils 14 are partially bored, so that the surfaces of the prepregs 12 coating the core section 10 are exposed so as to communicate the core section 10 to the outside.

Positions and sizes of the gas purging holes 14 may be optionally selected. In the present embodiment, the gas purging holes 140 are located near the pilot holes 18 so as to prevent expansion of the plated layers 19 on the inner faces of the pilot holes 18. In the present embodiment, a separation D between the gas purging hole 10 and the edge of the pilot hole 18 is 300-350 μm. When the gas purging holes 140 are formed, amount of etching side face of the gas purging holes 140 depends on thicknesses of the plated layers 19 and the copper foils 14, etching conditions, e.g., etching solution, etc. Therefore, the separation D may be designed on the basis of those conditions.

Figure 2A:
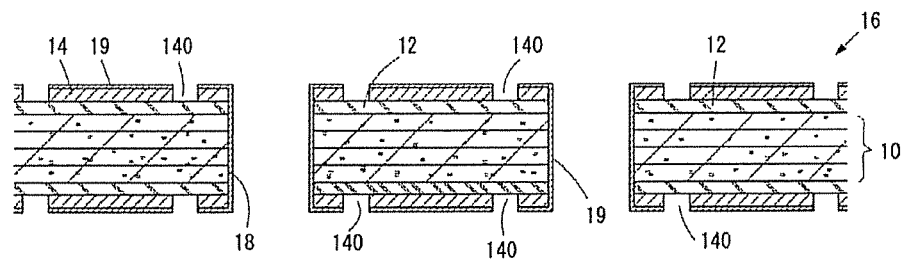
FIGS. 2A and 2B are partial sectional views showing the steps of forming the gas purging holes and filling the pilot holes with resin.

In FIG. 2A, the gas purging holes 140 are formed by etching the plated layers 19 and the copper foils 14 with using the resist patterns 70 as masks. The surfaces of the prepregs 12 are exposed in the gas purging holes 140, and the core section 10 is communicated to the outside of the base member 16 via the gas purging holes 140 so that the core section 10 is communicated to the outside.

Figure 3:
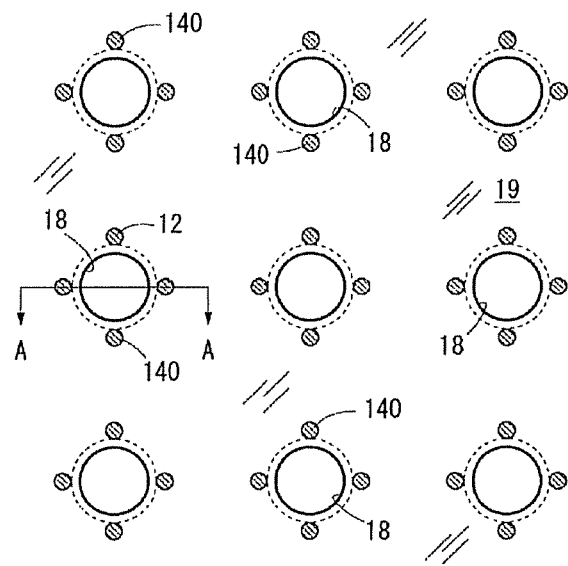
FIG. 3 is a plan view showing an arrangement of the pilot holes and the gas purging holes.

FIG. 3 is a partial plan view of the base member 16, in which the gas purging holes 140 are formed in the surface of the base member 16. The pilot holes 18 penetrating the base member 16 are regularly arranged in a matrix form. Further, four gas purging holes 140 are cruciately arranged around the edge of each of the pilot holes 18. The surfaces of the prepregs 12 are exposed in the gas purging holes 140 as inner bottom faces thereof. The surfaces of the base member 16 are the plated layers 19. Note that, FIG. 2A is a sectional view taken along a line A-A shown in FIG. 3.

The arrangement of the pilot holes 18 bored in the base member 16 is not limited to the matrix form, so they may be arranged optionally. A plurality of the gas purging holes 140 may be provided between the adjacent pilot holes 18, may be radially arranged with respect to each of the pilot holes 18 and may be merely regularly arranged in the surface of the base member 16.

As described above, the gas purging holes 140 are located near the edges of the pilot holes 18 so as to effectively purge the gas and/or water vapor from the parts near the pilot holes 18. If a large number of the gas purging hoes 140 are further formed in the surfaces of the base member 16 other than the parts near the pilot holes 18, the gas and/or water vapor can be easily purged from the core section 10. Further, many asperities, i.e., gas purging holes, are formed in the surfaces of the base member 16, so that bonding strength between the base member 16 and insulating layers, which are formed on the surfaces of the base member 16, can be increased.

Figure 2B:
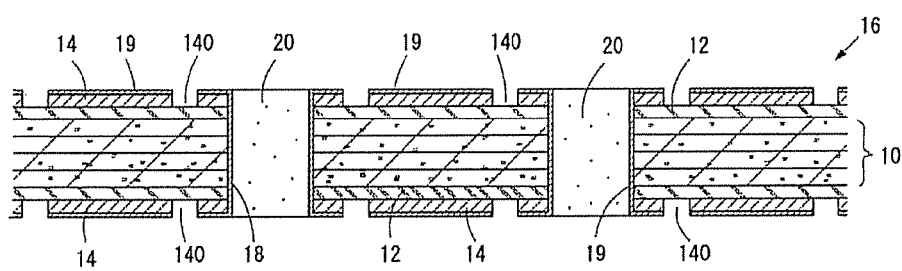

In FIG. 2B, the resin 20 is filled in the pilot holes 18 as insulating materials. The pilot holes 18 can be filled with the resin 20 by screen-printing or using a metal mask.

After filling the pilot holes 18 with the resin 20, the resin 20 is cured by the heating step. In the present embodiment, the resin 20 is thermosetting epoxy resin, and the resin 20 is cured at temperature of about 160□. Since the gas purging holes 140 are formed in the surfaces of the base member 16, the decomposition gas and/or water vapor generated from the core section 10 can be discharged or purged to the outside via the gas purging holes 140, so that expansion of the plated layers 19 and the copper foils 14 can be prevented.

After heat-curing the resin 20 in the pilot holes 18, ends of the cured resin 20, which are projected outward from the pilot holes 18, are abraded and flattened, so that end faces of the cured resin 20 are made level with the surfaces of the plated layers 19.

Figure 4A:
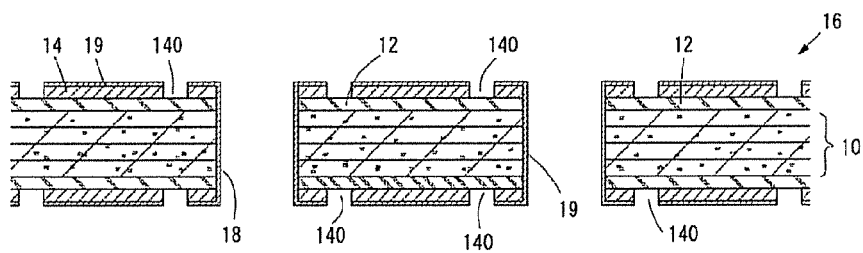
FIGS. 4A-4C are partial sectional views showing another process of producing the gas purging holes and filling the pilot holes with resin.
Figure 4B:
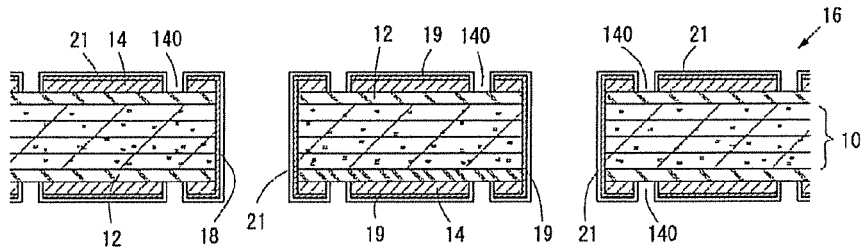

In FIGS. 4A-4B, the inner faces of the pilot holes 18 are coated with the plated layers 19, and then the inner faces of the pilot holes 18 are further coated with insulating films 21.

In FIG. 4A, the pilot holes 18 shown in FIG. 2A are coated with the plated layers 19.

In FIG. 4B, the insulating films 21 are formed on the copper foils 14 and the plated layers 18, which have been formed on the inner faces of the pilot holes 18 and the surfaces of the base member 16, by the electrodeposition method. The plated layers 19 entirely coat the inner faces of the pilot holes 18 and the both side faces of the base member 16. Therefore, the insulating films 21 can be formed on the inner faces of the pilot holes 18 and the entire side faces of the base member 16 by the electrodeposition method, in which the plated layers 19 are used as electric power feeding layers. For example, the insulating films 21 can be electrodeposited by a constant current method, in which the base member is soaked in an electrodeposition solution of epoxy resin and then a direct current is passed through the plated layers 19.

The insulating films 21 are formed to securely prevent short circuit between the pilot holes 18 and the plated through-hole sections.

After electrodepositing the insulating films 21 on the inner faces of the pilot holes 18 and the both side faces of the base member 16, a drying process and a heating process are performed so as to cure the insulating films 21. Thicknesses of the insulating films 21 are 10-20 μm.

Figure 4C:
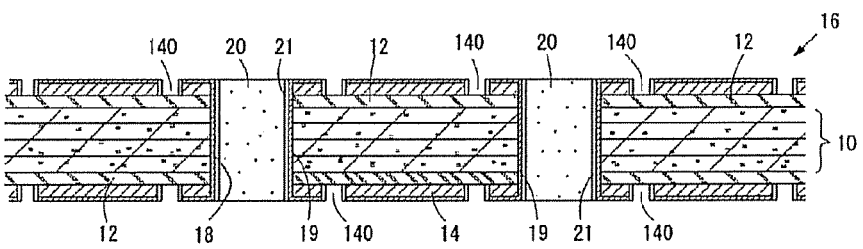

In FIG. 4C, the pilot holes 18, whose inner faces have been coated with the insulating films 21, are filled with the resin 20 as the insulating materials. While heat-curing the resin 20 in the pilot holes 18, the gas generated from the core section and water vapor generated from the base member 16 are discharged to the outside via the gas purging holes 140 formed in the surfaces of the base member 16, so that the problem of expanding the plated layers 19 and the insulating films 21 can be prevented.

After heat-curing the resin 20 in the pilot holes 18, ends of the cured resin 20, which are projected outward from the pilot holes 18, are abraded and flattened. At that time, the insulating films 21 coating the surfaces of the base member 16 are also abraded and removed, and the end faces of the cured resin 20 are made level with the surfaces of the base member 16.

By coating the inner faces of the pilot holes 18 with the plated layers 19, the rough inner faces of the pilot holes 18 can be made smooth, so that no voids are formed in the resin 20 when the pilot holes 18 are filled with the molten resin 20. Therefore, the short circuit between the core section and the plated through-hole sections, which is caused by voids formed in the resin 20, can be effectively prevented. By coating the plated layers 19 with the insulating films 21, the inner faces of the pilot holes 18 are made further smooth, filling rate of the resin 20 can be improved, and the insulating films 21 insulate the pilot holes 18 from the plated through-hole sections so that the short circuit between the core section 10 and the plated thorough-hole sections can be securely prevented.

The core substrate of the present embodiment is produced by: filling the pilot holes 18 bored in the base member 16 with the resin 20 as shown in FIG. 2B or 4C; laminating the cable layers on the both side faces of the base member 16; and forming the plated through-hole sections penetrating the pilot holes 18

If the thermal expansion coefficient of the core sections 10 of the base member 16 is significantly different from that of the cable layers, the cable layers will separate from the base member 16 or cracks will be formed in boundary faces therebetween. Thus, no electrically conductive members, e.g., copper foils, are provided between the base member 16 and the cable layers. Preferably, the prepregs (resin layers) 12 are exposed in the surfaces of the base member 16, and the insulating layers included in the cable layers are bonded to the insulating layers of the base member 16. In comparison with the case of bonding resin to copper foils, bonding strength between resins (insulating layers) is highly increased.

(Step of Etching Conductive Layers)

Thus, FIGS. 5A-5D show the steps of: coating the surfaces of the base member 16 with dry film resist (photo resist); and removing the copper foils 14 and the plated layers 19, wherein the copper foils 14 and the plated layers 19 having a prescribed width are left along edges of the pilot holes 18.

Figure 5A:
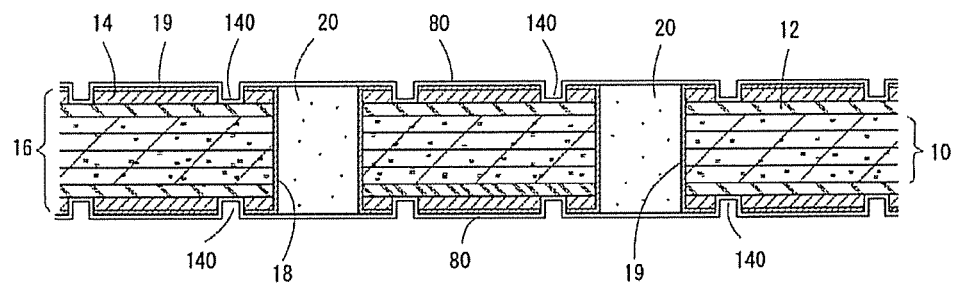
FIGS. 5A-5D are partial sectional views showing the steps of etching conductive layers formed on the both side faces of the base member.

In FIG. 5A, the pilot holes 18 of the base member 16 are filled with the resin 20, and then the surfaces of the base member 16 are coated with copper plated layers 80 by electroless plating.

Figure 5B:
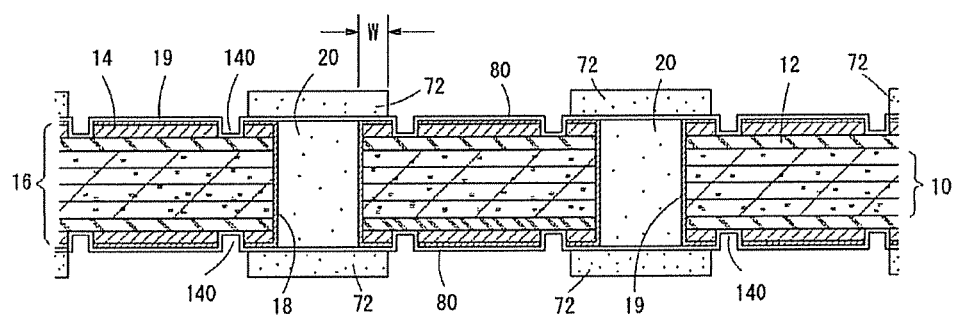

In FIG. 5B, dry film resist (photo resist) is applied on the both side faces of the base member 16, and then the photo resist is optically exposed and developed so as to form resist patterns 72. The resist patterns 72 having a prescribed width coat the edges of the pilot holes 18.

Figure 5C:
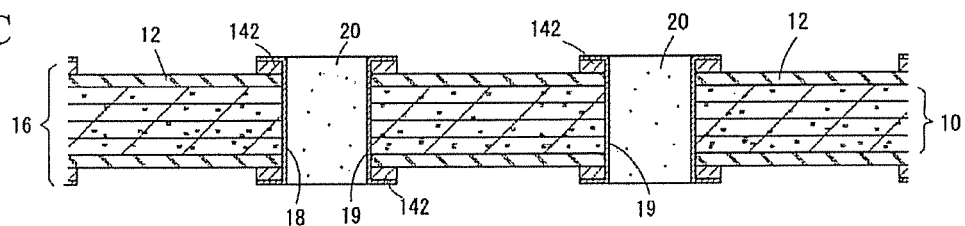

In FIG. 5C, chemical etching is performed with using the resist patterns 72 as masks, so that the copper plated layers 80, the plated layers 19 and the copper foils 14 are removed and partially left.

The resist patterns 72 having the prescribed width coat the pilot holes 18 and the edges thereof. Therefore, by performing the etching with using the resist patterns 72 as masks, the ring-shaped copper foils 14 and the plated layers 19 are partially left along the edges of the pilot holes 18.

Figure 5D:
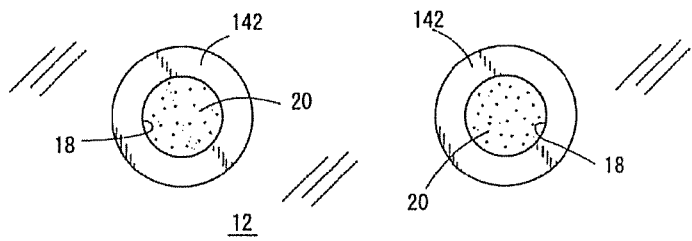

In FIG. 5D, the copper foils 14 and the plated layers 19 are left along the edges of the pilot holes 18, so that lands 142 are formed. The prepregs 12 are exposed in the surfaces of the base member 16, and the pilot holes 18 are filled with the resin 20. The end faces of the cured resin 20 in the pilot holes 18 are made level with end faces of the lands 142.

In the step shown in FIG. 5A, the both side faces of the base member 16 are coated by the electroless plating, so that only the resist patterns 72 can be easily removed from the resin 20 cured in the pilot holes 18 when the resist patterns 72 are removed after etching the copper foils 14 and the plated layers 19.

If the dry film resist is applied on the both side faces of the base member 16 without electroless-plating the both side faces of the base member 16, the dry film resist is tightly bonded to the resin 20 because they are resins. Namely, the resist patterns 72 cannot be easily removed from the resin 20 after performing the etching process. If the dry film resist (resist patterns 72) are forcibly peeled or chemically removed from the resin 20, burrs will be formed in the end faces of the resin 20 or the end faces thereof will be damaged.

On the other hand, the surfaces of the base member are previously coated by the electroless copper plating, and then dry film resist is applied thereon. Therefore, the dry film resist (resist patterns 72) can be easily removed by a liftoff procedure or chemically dissolving the copper plated layers 80. By performing the electroless copper plating, the copper plated layers 80 are provided between the end faces of the resin 20 and the resist patterns 72, and the copper plated layers 80 act as release layers.

Thicknesses of the copper plated layers 80 acting as the release layers may be about 0.5-1 μm. The electroless-plated layers acting as the release layers may be composed of not only copper but also other metals. Note that, the electroless copper plating can be easily performed, and copper layers can be easily etched.

As shown in FIG. 5B, in the present embodiment, the dry film resist is patterned so as to leave the copper foils 14 and the plated layers 19, whose width is w, along the edges of the pilot holes 18 when the resist patterns 72 are formed on the both side faces of the base member 16. The copper foils 14 and the plated layers 19 are partially left along the edges of the pilot holes 18 so as not to etch the plated layers 19 coating the inner faces of the pilot holes 18 while etching the copper foils 14 and the plated layers 19. If the resist patterns 72 coat the opening sections of the pilot holes 18 only, an etching solution invades to the inner faces of the pilot holes 18 and etches them while etching the copper foils 14 and the plated layers 19.

In FIG. 5B, each of the resist patterns 72 coating the pilot holes 18 is extended the distance w from the edge of the pilot hole 18. In this state, side faces of the lands 142 are etched by chemically etching the copper foils 14 and the plated layers 19. Amount of etching the side face depends on etching conditions, e.g., thicknesses of the copper foils 14 and the plated layers 19, etching solution, injection pressure of an etching solution. The amount of etching the side face is about 70% of the thickness of the layer to be etched. Therefore, the extended distance W of the resist patterns 72 is set, with considering the amount of etching the side faces, so as to prevent the etching solution from reaching the inner faces of the pilot holes 18. Namely, the plated layers 19 coating the inner faces of the pilot holes 18 must be protected.

(Steps of Forming Cable Layers)

FIGS. 6A-7B show the steps of: forming the cable layers on the both side faces of the base member, in which the lands 142 are formed along the edges of the pilot holes 18 by the above described steps; and forming the plated through-hole sections.

Figure 6A:
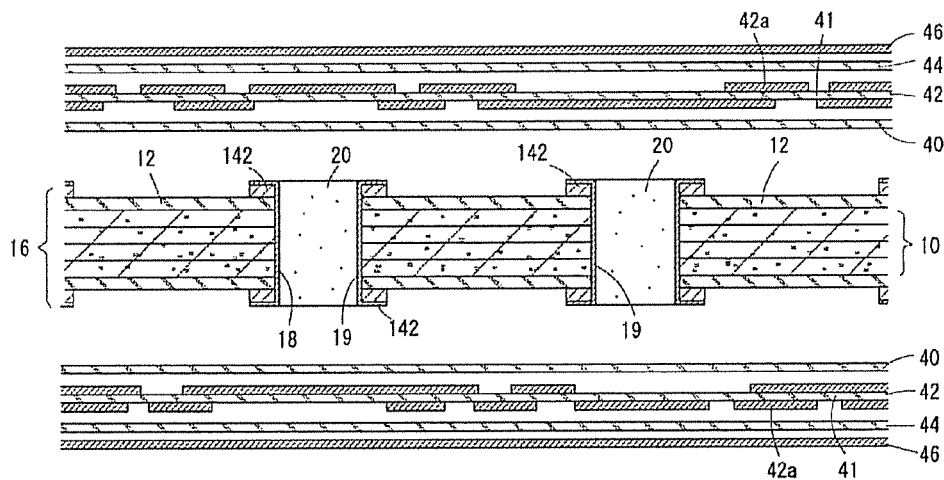
FIGS. 6A-6C are partial sectional views showing the steps of producing another base member.

In FIG. 6A, prepregs 40, cable sheets 42, prepregs 44 and copper foils 46 are laminated in this order. Each of the cable sheets 42 is constituted by an insulating resin sheet 41 and cable patterns 42*a*, which are formed on the both faces of the insulating resin sheet 41. The cable sheet 42 may be formed by etching copper foil layers of a copper-bonded substrate, which is constituted by an insulating resin sheet composed of a glass cloth and copper foils bonded on the both faces of the insulating resin sheet, in prescribed patterns.

Figure 6B:
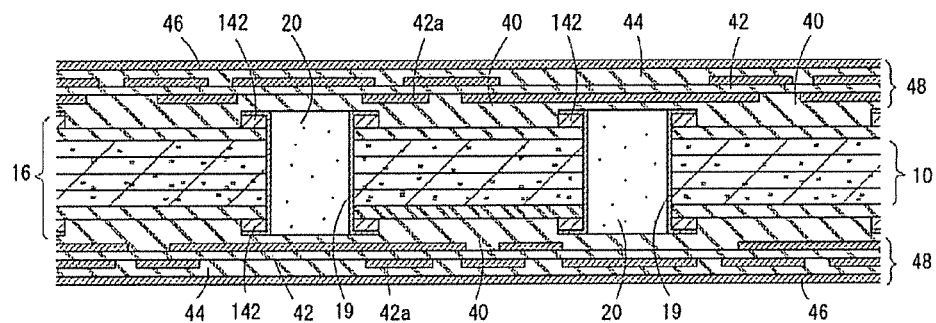

In FIG. 6B, the prepregs 40, the cable sheets 42, the prepregs 44 and the copper foils 46, which have been correctly positioned on the both side faces of the base member 16, are heated and pressurized, so that the prepregs 40 and 44 are cured and cable layers 48 are integrally laminated on the base member 16. The prepregs 40 and 44 are formed by impregnating glass cloths with resin, and the uncured prepregs 40 and 44 are provided between layers. By the heating and pressurizing process, the prepregs 40 and 44 insulate and integrate the cable layers 48.

Figure 6C:
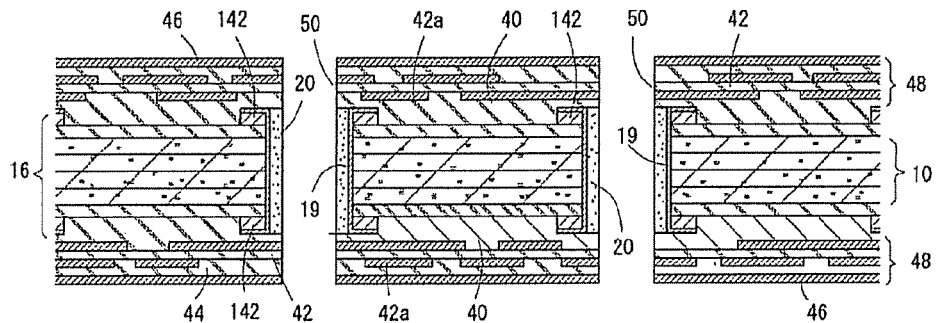

In FIG. 6C, through-holes 50 are bored in the base member 16, on which the cable layers 48 have been laminated, so as to form the plated through-hole sections. The through-holes 50 are coaxial with the pilot holes 18 and bored, by a drill, in the thickness direction of the base member 16, which has been integrated with the cable layers 48. Since diameters of the through-holes 50 are smaller than those of the pilot holes 18, the resin 20 is exposed in the inner faces of the through-holes 50 passing through the resin 20.

Figure 7A:
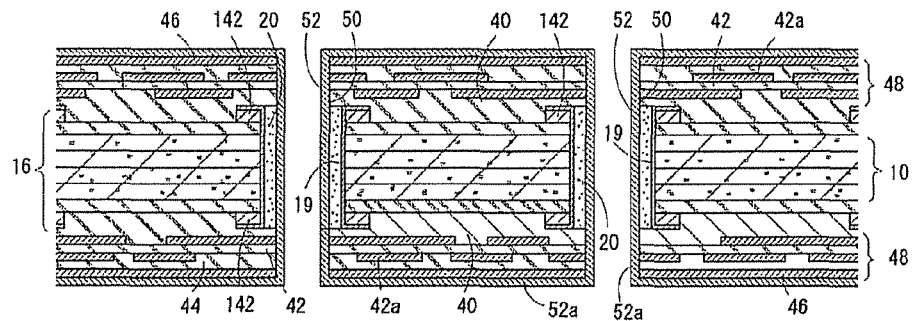
FIGS. 7A and 7B are partial sectional views showing further steps of producing another base member.

In FIG. 7A, the base member 16 is plated with copper by an electroless plating method and an electrolytic plating method so as to form the plated through-hole sections 52 on the inner faces of the through-holes 50 after forming the through-holes 50. By performing the electroless plating method, the inner faces of the through-holes 50 and the entire surfaces of the base member 16 are coated with copper. Then, the electrolytic plating method is performed with using the copper layer formed by the electroless plating method as electric power feeding layers, so that the inner faces of the through-holes 50 and the entire surfaces of the base member 16 are coated with plated layers 52*a*. The plated layers 52*a* formed on the inner faces of the through-holes 50 acts as the plated through-hole sections 52, which mutually connect cable patterns formed on the both side faces of the base member 16.

Figure 7B:
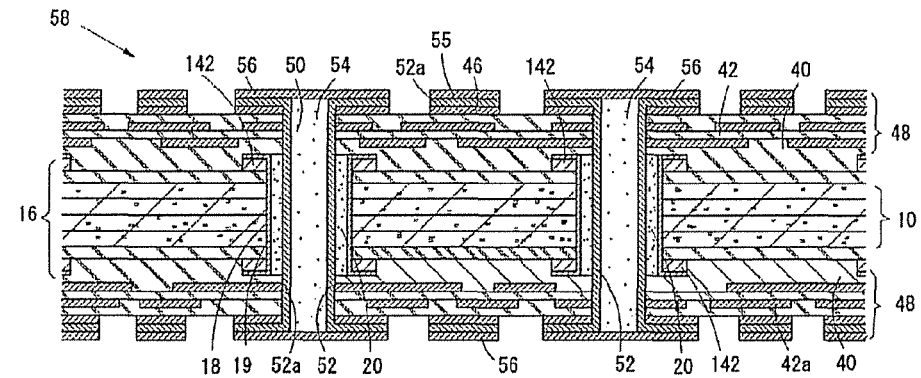

In FIG. 7B, after forming the plated through-hole sections 52, the through-holes 50 are filled with resin 54, cap-plated layers 55 are formed, and then cable patterns 56 are formed by etching the copper foils 46, the plated layers 52a and the cap-plated layers 55, which are formed on the both side faces of the base member, in prescribed patterns, so that the core substrate 58 can be produced.

The cable patterns 56 formed on the both side faces of the core substrate 58 are mutually electrically connected by the plated through-hole sections 52. Further, the inner cable patterns 42a in the cable layers 48 are connected to the plated through-hole sections 52 at suitable positions.

In the core substrate 58, the inner faces of the pilot holes 18, which are formed in the base member 16 including the core section 10, are coated with the plated layers 19, so that the short circuit between the core section 10 and the plated through-hole sections 52 can be prevented.

Figure 8:
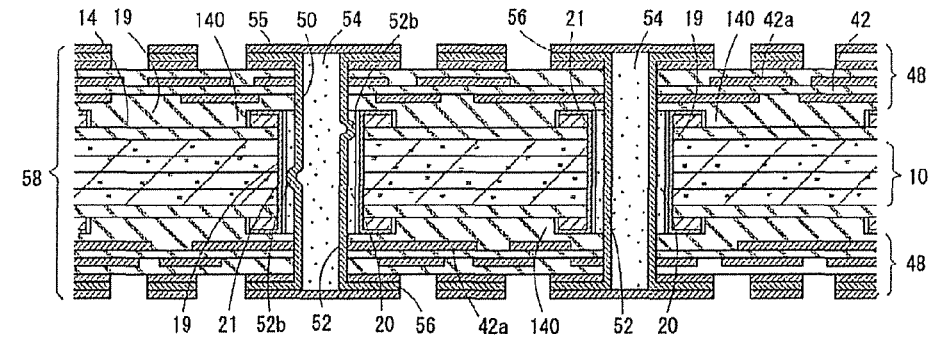
FIG. 8 is a partial sectional view of a modified base member.

FIG. 8 shows the core substrate 58 including the base member 16 shown in FIG. 4C, in which the inner faces of the pilot holes 18 are coated with the plated layers 19 and insulating films 21.

In this case too, the core substrate 58 can be produced by laminating the cable layers 48 on the both side faces of the base member 16 as well as the process shown in FIGS. 6A-7B. The cable patterns 56 are formed on the both side faces of the core substrate 58, and the cable patterns 56 are mutually electrically connected by the plated through-hole sections 52.

In the core substrate 58 of the present embodiment, the inner faces of the pilot holes 18 formed in the core section 10 are doubly coated with the plated layers 19 and the insulating films 21, and the insulating films 21 are exposed on the inner faces of the pilot holes 18. Therefore, even if voids are formed in the resin 20 and the voids make expanded parts 52b in the plated through-hole section 52 when the pilot holes 18 are filled with the resin 20, the insulating film 21 exists between the expanded parts 52b and the plated layer 19 so that short circuit between the plated through-hole sections 52 and the core section 10 can be prevented.

(Steps of Producing Circuit Board)

The circuit board can be produced by laminating the cable patterns on the both side faces of the core substrate 58.

Figure 9:
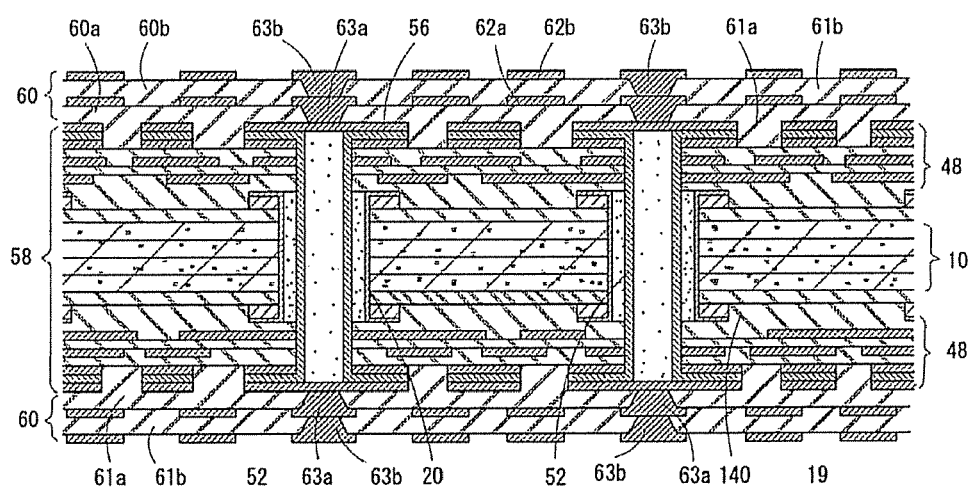
FIG. 9 is a partial sectional view of a circuit board.

In the circuit board shown in FIG. 9, build-up layers 60, each of which is constituted by two build-up layers 60a and 60b, are formed on the both side faces of the core substrate 16 shown in FIG. 7B.

Each of the first build-up layers 60a includes: an insulating layer 61a; a cable pattern 62a formed on a surface of the insulating layer 61a; and vias 63a electrically connecting the lower cable pattern 56 to the upper cable pattern 62a. Each of second build-up layers 60b includes: an insulating layer 61b; a cable pattern 62b; and vias 63b.

The cable patterns 62a and 62b, which are included in the build-up layers 60 formed on the both side faces of the core substrate 58, are mutually electrically connected by the plated through-hole sections 52 and the vias 63a and 63b.

The steps of forming the build-up layers 60 will be explained.

Firstly, insulating layers 61a are formed on the both side faces of the core substrate 58 by laminating insulating resin films, e.g., epoxy film, and via holes, in which the vias 63a will be formed and in which the cable patterns 56 formed on the side faces of the core substrate 58 are exposed, are bored in the insulating layers 61a by laser means.

Next, the inner faces of the via holes are desmear-treated so as to roughen the inner faces thereof, and then the inner faces of the via holes and the surfaces of the insulating layers 61a are coated with copper layers by the electroless plating.

Then, the electroless-plated copper layers are coated with photoresist, and resist patterns, in which parts of the electroless-plated copper layers which will be formed as the cable patterns 62a are exposed, are formed by optically exposing and developing the photoresist.

Further, the electrolytic plating, in which the resist patterns are used as masks and in which the electroless-plated copper layers are used as electric power feeding layers, is performed so as to supply copper to the exposed parts of the electroless-plated copper layers for uprising the copper therein. In this step, the via holes are filled with copper supplied by the electrolytic plating method and the vias 63a are formed.

Next, the resist patterns are removed, and the exposed parts of the electroless-plated copper layers are etched and removed, so that cable patterns 62a are formed, in prescribed patterns, on the surfaces of the insulating layers 61a.

The second build-up layers 60b can be formed as well as the first build-up layers 60a.

Electrodes, to which semiconductor elements will be connected, or connecting pads, to which external connectors will be connected, are patterned in the outermost layers, and the outermost layers other than the exposed parts, e.g., electrodes, connecting pads, are coated with protection films. The exposed electrodes or connecting pads are plated with, for example, gold for protection.

The circuit board may be produced by other methods. The steps of forming the cable layers on the both side faces of the core substrate 58 are not limited to the above described steps.

In the above described embodiments, the base member has the core section 10 composed of electrically conductive carbon fiber-reinforced plastic. The present invention may be applied to base members having core sections composed of other electrically conductive materials.

Further, the present invention can be applied to general methods of producing circuit boards, wherein pilot holes or through-holes are filled with resin, surfaces of base members are coated with dry film resist (photo resist) and cable layers on the surfaces of the base members are patterned. In these cases, the base member is once electroless-plated, without directly coating the base member, whose pilot holes or through-holes have been filled with resin, with dry film resist, so as to form release layers for easily separating or releasing the dry film from the resin, and then the dry film resist is applied onto the release layers.

The invention may be embodied in other specific forms without departing from the spirit of essential characteristics thereof. The present embodiments are therefore to be considered in all respects as illustrative and not restrictive, the scope of the invention being indicated by the appended claims rather than by the foregoing description and all changes which come within the meaning and range of equivalency of the claims are therefore intended to be embraced therein.

What is claimed is:

1. A method of producing a substrate, comprising the steps of:
    forming a through-hole in a base member with the base member having a copper film and a plated layer;
    filling the through-hole with an insulating material;
    performing electroless plating to coat the surface of the base member, in which the through-hole has been filled with the insulating material, with an electroless-plated layer;
    applying photo resist on the electroless-plated layer formed on the surface of the base member;

optically exposing and developing the photo resist so as to form a resist pattern coating an end face of the through-hole filled with the insulating material;

etching an electrically conductive layer formed on the surface of the base member with using the resist pattern as a mask with the electrically conductive layer comprising the copper layer, the plated layer and the electroless-plated layer; and removing the resist pattern coating the end face of the through-hole from the base member with using the electroless-plated layer as a release layer, wherein the through-hole is a pilot hole for forming a plated through-hole section penetrating the through-hole; and the pilot hole is filled with the insulating material, and then the electroless plating for coating the surface of the base member is performed, wherein the electroless plating for coating the surface of the base member is performed, an end face of the pilot hole filled with the resin is coated with the resist pattern, and the conductive layer on the surface of the base member is etched to remove the resist pattern; and a through-hole penetrating the pilot hole is formed, and an inner face of the through-hole is coated by plating so as to form the plated through-hole section, and wherein cable layers are laminated on the both side faces of the base member after removing the resist pattern from the base member; and the through-hole penetrating the pilot hole is formed in the base member, on which the cable layers have been integrally laminated, so as to form the plated through-hole section.

2. The method according to claim 1,
wherein the base member has an electrically conductive core section;
the inner face of the through-hole is coated with a plated layer, which is formed by plating the base member, after forming the through-hole; and
the surface of the base member is coated by performing electroless plating after filling the through-hole with the resin.

3. The method according to claim 2,
wherein the through-hole is a pilot hole for forming a plated through-hole section penetrating the through-hole;
the inner face of the pilot hole is coated with a plated layer, which is formed by plating the base member; and
the surface of the base member is coated by performing the electroless plating after filling the pilot hole with the insulating material.

4. The method according to claim 3,
wherein the inner face of the pilot hole is coated with an insulating film, which is formed by an electrodeposition method in which the plated layer is used as an electric power feeding layer, after coating the inner face of the pilot hole with the plated layer; and
the pilot hole, whose inner face has been coated with the insulating film, is filled with the insulating material.

5. The method according to claim 3,
wherein a through-hole penetrating the pilot hole is formed, and the inner face of the through-hole is coated with a plated layer so as to form the plated through-hole section after performing the steps of performing the electroless plating to coat the surface of the base member, forming the resist pattern, etching the conductive layer formed on the surface of the base member, and removing the resist pattern from the base member.

6. The method according to claim 5,
wherein cable layers are laminated on the both side faces of the base member after removing the resist pattern from the base member; and
the through-hole penetrating the pilot hole is formed in the base member, on which the cable layers have been integrally laminated, so as to form the plated through-hole section.

7. The method according to claim 6,
wherein the through-hole is filled with resin after forming the plated through-hole section is formed; and
the conductive layer on the surface of the base member is etched in a prescribed pattern so as to form a cable pattern, which is electrically connected to the plated through-hole section, on the surface of the base member.

8. The method according to claim 7,
wherein cable layers are laminated on the both side faces of the substrate to form a multi-layered substrate.

9. The method according to claim 8,
wherein the cable layers are laminated on the both side faces of the substrate by a build-up method.

10. The method according to claim 2,
wherein the core section is formed into a flat plate by heating and pressurizing a plurality of prepregs including carbon fibers.

11. The method according to claim 1,
wherein electroless copper plating is performed as the electroless plating for coating the surface of the base member, whose through-hole has been filled with the insulating material.

* * * * *